United States Patent [19]

Walker

[11] Patent Number: 5,694,085

[45] Date of Patent: Dec. 2, 1997

[54] HIGH-POWER AMPLIFIER USING PARALLEL TRANSISTORS

[75] Inventor: Mark A. Walker, Palmyra, Mo.

[73] Assignee: Glenayre Electronics, Inc., Charlotte, N.C.

[21] Appl. No.: 601,370

[22] Filed: Feb. 14, 1996

[51] Int. Cl.[6] .............................. H03F 3/68; H03F 3/191
[52] U.S. Cl. ........................... 330/295; 330/302; 330/306
[58] Field of Search ................................. 330/124 R, 277, 330/295, 302, 306

[56] References Cited

U.S. PATENT DOCUMENTS 3,471,796  10/1969  Wright ........................... 330/295 X
5,420,537  5/1995  Weedon et al. ..................... 330/296 X Primary Examiner—Steven Mottola
Attorney, Agent, or Firm—Christensen O'Connor Johnsonson & Kindness PLLC

[57] ABSTRACT

An input radio frequency signal to be amplified is fed to the gate terminals of parallel field effect power transistors through impedance matching networks that comprise parallel resistor-capacitor combinations. The capacitor is selected so that it is self-resonant at the frequency of operation, thereby preventing attenuation of the input signal at that frequency. A shunt resistor is coupled between the gates of the parallel transistors to eliminate odd mode oscillations.

5 Claims, 2 Drawing Sheets

5,694,085

HIGH-POWER AMPLIFIER USING PARALLEL TRANSISTORS

FIELD OF THE INVENTION

The present invention relates generally to radio frequency (RF) electronic amplifier circuits and, more particularly, to radio frequency amplifier circuits using parallel field effect transistors.

BACKGROUND OF THE INVENTION

All radio frequency transmitters employ amplifiers that boost the power of a desired signal from a relatively low level to a higher level. The output signals of the amplifiers are generally fed to an antenna system that broadcasts the RF signals to one or more remotely located receivers. For very high-power applications, radio frequency amplifiers still use vacuum tubes as the active elements for boosting the power of the radio frequency signals. However, for lower power applications, most amplifiers use solid state devices such as field effect transistors (FETs).

A common RF amplifier design uses only a single power FET in its output stage so that the amplifier is stable, i.e., free from oscillation, over a wide range of frequencies. However, amplifiers using only a single power FET are limited in the power levels they can produce. In order to increase the power rating of the amplifier, some RF amplifiers use two or more power FETs that are connected in parallel. Because each FET contributes only a portion of the total power, the combined power can be increased without damaging the individual devices. Such parallel high-power RF FET amplifier circuits are therefore generally more reliable than single transistor designs.

Despite their advantages over single transistor designs, parallel high-power FET amplifiers are susceptible to so-called "parallel FET oscillation" or "odd mode oscillation," which makes the amplifiers unstable. These undesirable oscillations are believed to be caused by the self-resonant circuits formed by the internal parasitic capacitances of the FET devices and the inductance of the wires that connect them in the circuit. As will be explained in further detail below, the odd mode oscillation currents induced at resonance can quickly destroy the transistors.

To prevent the undesired odd mode oscillation, conventional parallel high-power FET amplifiers typically have a series resistive matching networks to help attenuate the gate currents in the parallel FET devices. The problem with the matching networks is that they also attenuate the RF signal to be amplified. Therefore, there is a need for a parallel FET amplifier design that prevents odd mode oscillations but does not attenuate the RF signal of interest.

SUMMARY OF THE INVENTION

To increase the gain and eliminate odd mode oscillation, a high-power radio frequency amplifier circuit according to the present invention includes a pair of field effect transistors connected in parallel. The input radio frequency signal to be amplified is connected to a gate terminal of each transistor through a matching network comprising a parallel resistor-capacitor combination. The capacitor is selected so that it is self-resonant at the frequency of operation. Because the resistors of the matching networks are essentially shorted at the frequency of interest, there is little or no attenuation of the input signal before it reaches the gate terminals of the transistors. A bypass resistor is disposed between the gate terminals of the parallel transistors to eliminate odd mode oscillations.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
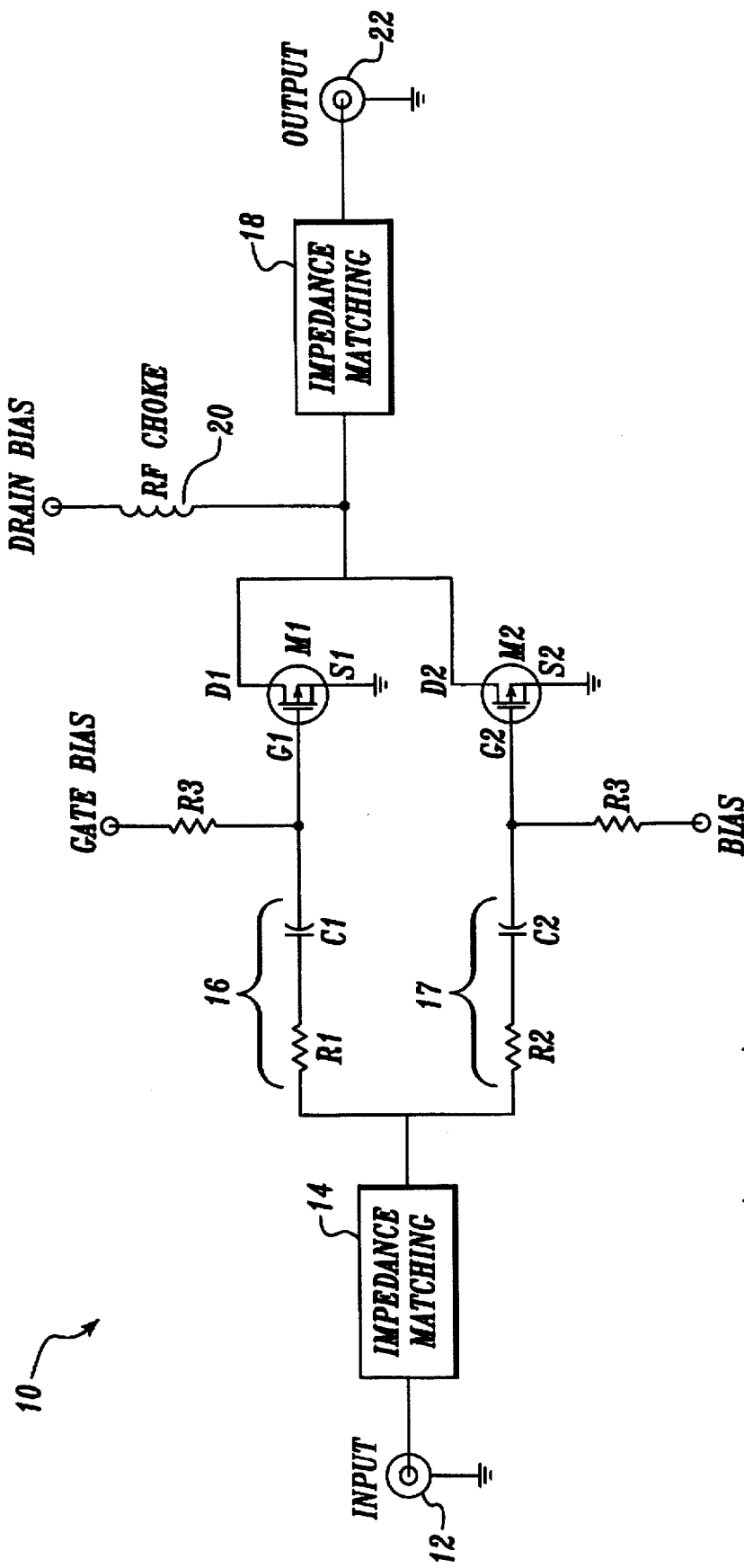
FIG. 1 is a schematic diagram of a conventional parallel FET amplifier.

The conventional parallel FET high-power RF amplifier circuit 10 shown in FIG. 1 uses a resistive matching network. The amplifier circuit 10 includes two n-channel metal oxide silicon FETs $M_1$ and $M_2$. The FET $M_1$ has a source terminal $S_1$, a drain terminal $D_1$ and a gate terminal $G_1$. Similarly, the FET $M_2$ has a source terminal $S_2$, a drain terminal $D_2$ and a gate terminal $G_2$. The drain terminal $D_1$ of the FET $M_1$ is tied to the drain terminal $D_2$ of the second FET $M_2$. In addition, the drain terminals $D_1$ and $D_2$ of transistors $M_1$ and $M_2$ are biased through an RF choke 20 to a stable voltage supply. The source terminals $S_1$ and $S_2$ of both FETs are grounded. Finally, the gate terminals $G_1$, $G_2$ of both FETs are coupled to a stable voltage source through a biasing resistor $R_3$.

The input RF signal to be amplified is received from an input connector 12 and is passed through a conventional impedance matching network 14 that matches the input impedance of the amplifier 10 to the output impedance of the signal source. After passing through the impedance matching network 14, the input signal is coupled to the gates $G_1$ and $G_2$ through a pair of series resistive matching networks 16 and 17. The matching network 16 comprises a series combination of a resistor $R_1$ and a capacitor $C_1$. Similarly, the resistive matching network 17 comprises the series combination of a resistor $R_2$ and a capacitor $C_2$. The values of the capacitors $C_1$ and $C_2$ are selected so that they are self-resonant, i.e., they act like short circuits, at the frequency of input RF signal to be amplified. After passing through the resistors $R_1$ and $R_2$, the input signal is applied to the gate terminals $G_1$ and $G_2$ and amplified.

After being amplified by the transistors $M_1$ and $M_2$, the output signal produced is passed through a conventional impedance matching circuit 18 that matches the output impedance of the transistors to the input impedance of the element that is driven by the amplifier. Finally, the output of the impedance matching circuit 20 is connected to an output connector 22.

As indicated above, a problem with known parallel FET amplifier circuits is that they are susceptible to odd mode oscillations. When this happens, the transistor $M_1$ is conducting current from the drain terminal $D_1$ to the source terminal $S_1$ while the FET $M_2$ is conducting current from its source $S_2$ to the drain terminal $D_2$. Similarly, when the FET $M_1$ is conducting current from its source terminal $S_1$ to the drain terminal $D_1$, the FET $M_2$ is conducting current from its drain terminal $D_2$ to the source terminal $S_2$. At resonance, the currents conducted in the odd mode oscillation can be great enough to destroy the FETs $M_1$ and $M_2$.

In order to reduce or eliminate odd mode oscillation the gate currents that oscillate between gates $G_1$ and $G_2$ are attenuated by the resistors $R_1$, $R_2$ in the matching networks 16 and 17. While the resistors $R_1$ and $R_2$ work well to eliminate the odd mode oscillation, they also attenuate the input signal to be amplified by the FETs $M_1$ and $M_2$ due to the voltage divider created by the resistors $R_1$ and $R_2$ and the gate to source impedance of the FETs $M_1$ and $M_2$. Therefore, the magnitude of the output signal produced by the FETs is reduced.

Figure 2:
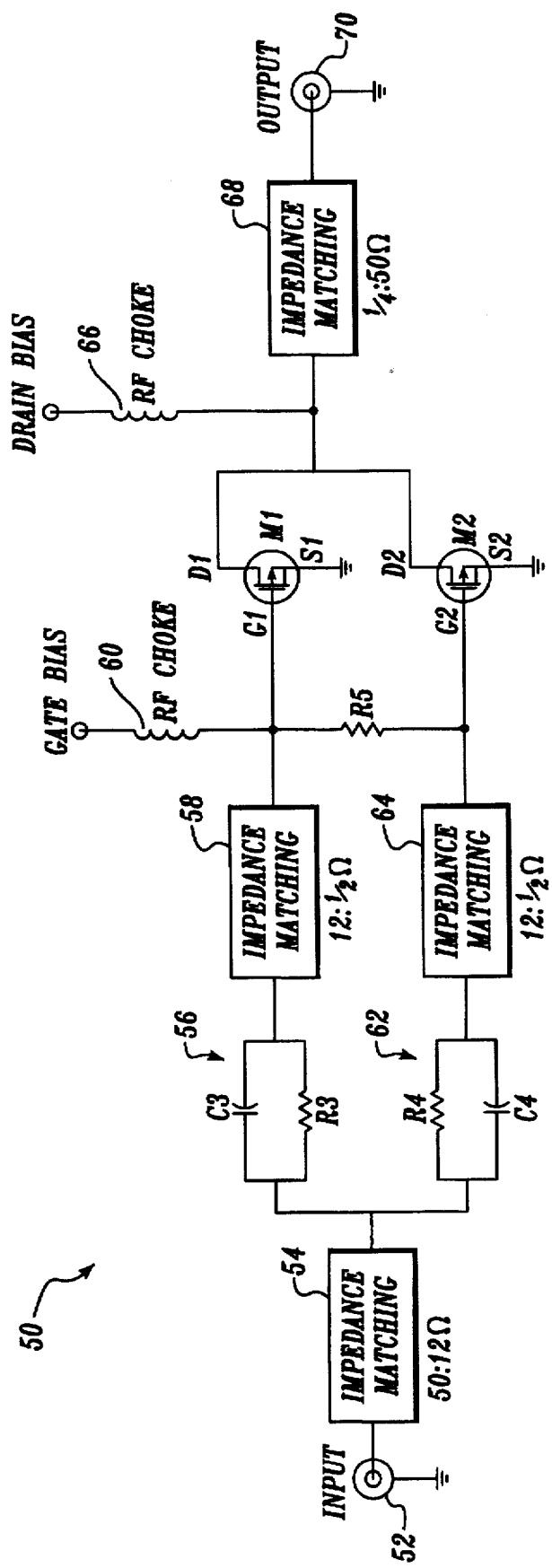
FIG. 2 is a schematic diagram of one embodiment of a parallel FET amplifier according to the present invention.

FIG. 2 is a schematic diagram of a parallel FET radio frequency amplifier circuit according to the present invention. As will be described in further detail below, the amplifier circuit does not attenuate the RF signal to be amplified but still eliminates odd mode oscillations. The amplifier circuit 50 uses the same pair of parallelly connected FETs $M_1$ and $M_2$ described above. In particular, the drain terminals $D_1$ and $D_2$ of the FETs are coupled together and biased with a stable voltage supply through an appropriate choke 66. The source terminals $S_1$ and $S_2$ are grounded.

The input RF signal to be amplified is received from an input connector 52 and applied to a conventional impedance matching circuit 54. In the presently preferred embodiment of the invention, the impedance matching circuit converts the input impedance from 50 Ohms to approximately 12 Ohms. The output of the impedance matching circuit 54 is divided into two branches which feed the gate terminals $G_1$ and $G_2$ of the parallel FETs. The first branch includes a matching network 56 that is comprised of the parallel combination of a capacitor $C_3$ and resistor $R_3$. The output of the matching network 56 feeds a second impedance matching network 58 that converts a 12-Ohm impedance to approximately ½ Ohm. The output of the second matching network 56 feeds the gate terminal $G_1$ of the FET $M_1$.

In the second branch a second impedance matching network 62 is coupled between the gate $G_2$ and the impedance matching network 54. The second network 62 is comprised of the parallel combination of a capacitor $C_4$ and a resistor $R_4$. The output of the matching network 62 feeds an impedance matching network 64 that also converts a 12-Ohm impedance to approximately ½ Ohm. The output of the impedance matching network 64 is coupled to the gate terminal $G_2$ of the FET $M_2$. The output signals produced by the FETs $M_1$ and $M_2$ are fed through an impedance matching network 68 that converts a ¼ Ohm impedance to approximately 50 Ohms. The output of the impedance matching network 68 is coupled to an output connector 70.

In practice, the capacitors $C_3$ and $C_4$ of the matching networks 56 and 62 are selected to be self-resonant at the frequency of interest. Therefore, when amplifying the input RF signal, the resistors $R_3$ and $R_4$ appear to be shorted. Therefore, the input RF signal is not attenuated before reaching the gate terminals $G_1$ and $G_2$ and the power of the output signal produced by the FETs $M_1$ and $M_2$ is increased.

At frequencies below the frequency of interest, the resistors $R_3$ and $R_4$ dominate the input impedance of the amplifier and allow little of the input RF signal to reach the gates $G_1$ and $G_2$ of the FETs. Similarly, at frequencies above the frequency of interest, the inductive effects of the capacitors $C_3$ and $C_4$ in combination with the resistors $R_3$ and $R_4$ allow little of the input signal to reach the transistors. By proper selection of the capacitors $C_3$, $C_4$ and the resistors $R_3$, $R_4$, the amplifier 50 can be tailored to have a narrow band of operation.

To prevent the odd mode oscillation, a bypass resistor $R_5$ is coupled between the gates $G_1$ and $G_2$ of the FETs $M_1$ and $M_2$. In practice, the resistor $R_5$ should be selected so that it presents a lossy impedance. This is achieved by selecting the resistance of the resistor $R_5$ to have a value that is several times the value of the input impedance of the transistors $M_1$ or $M_2$. If the value of the resistor $R_5$ is too great, then the circuit sees a virtual open circuit between the gates and the resistor will have no effect in diverting the alternating gate currents that occur during odd mode oscillations. However, if the value of the resistor $R_5$ is made too small, then it will perform as a virtual short in the circuit and its inductive effect will change only the frequency at which the odd mode oscillations occur. In the presently preferred embodiment of the invention, the value of $R_5$ is selected to be between two and ten times the gate-to-source impedance of either FET. When amplifying the input RF signal, the bypass resistor $R_5$ has no effect because the voltage at either side of the resistor is the same and no current flows through the resistor.

In the preferred embodiment of the invention, the amplifier 50 is used to amplify paging signals transmitted in the 900–960 MHz range. Preferably, the FETs $M_1$ and $M_2$ comprise MRF 184s manufactured by Motorola of Phoenix, Ariz. Each of these FETs has an input impedance of approximately ½ Ohm. The bypass resistor $R_5$ is selected to have a resistance of approximately 6 Ohms. The parallel matching networks 56 and 62 are comprised of 15-Ohm resistors in parallel with 33-picofarad capacitors.

As can be seen from the above description, the amplifier 50 of the present invention provides high power due to the parallel combination of the FETs but does not suffer from odd mode oscillation due to the presence of the bypass resistor $R_5$. In addition, the parallel matching networks 56 and 62 act as short circuits at the frequency of interest, thereby reducing or eliminating the attenuation associated with conventional series resistive matching networks 16 and 17 shown in FIG. 1.

While the present invention has been described with respect to its preferred embodiment, those skilled in the art will recognize that changes can be made. For example, although the presently preferred embodiment of the invention uses MOSFETs, other types of transistors including J-FETs or even bipolar transistors could be used. In addition, it is possible to increase the number of transistors that are connected in parallel by connecting their drain terminals together, providing a parallel matching network in series with each gate terminal, and adding an appropriate bypass resistor between the gate terminals. Therefore, it is intended that the scope of the invention be determined solely from the following claims.

The embodiments of the invention in which an exclusive property or privilege is claimed are defined as follows:

1. An amplifier circuit for amplifying an input signal comprising:

a pair of transistors each having a first and second terminal between which an amplified current is conducted and a control terminal that controls an amount of current conducted between the first and second terminal, wherein the first terminals of each transistor of the pair of transistors are coupled together;

a pair of parallel matching networks each comprising a resistor and capacitor connected in parallel, each parallel matching network of the pair being disposed between and in series with the control terminal of one of the transistors of the pair of transistors and the input signal, the resistor and capacitor of each parallel matching network cooperating to attenuate input signals both above and below a frequency of interest, while allowing input signals at the frequency of interest to reach the transistor substantially unattenuated; and a bypass resistor coupled between the control terminals of the pair of transistors, the bypass resistor having a resistance such that unbalanced modes are rejected.

2. The amplifier of claim 1, wherein the bypass resistor has a resistance selected to be approximately two to ten times an input impedance of the pair of transistors.

3. The amplifier of claim 1, wherein the pair of transistors are MOSFETs.

4. The amplifier of claim 1, wherein the input signal has a fundamental frequency and wherein the capacitor of the parallel matching networks is self-resonant at the fundamental frequency of the input signal.

5. An amplifier circuit for amplifying an input signal comprising;

a plurality of transistors each having a first and second terminal between which an amplified current is conducted and a control terminal that controls an amount of current conducted between the first and second terminals, wherein the first terminals of each transistor of the plurality of transistors are coupled together;

a plurality of parallel matching networks each comprising a resistor and capacitor connected in parallel, each parallel matching network of the plurality of parallel matching networks being disposed between and in series with a control terminal of one of the plurality of transistors and the input signal, the resistor and capacitor of each parallel matching network cooperating to attenuate input signals both above and below the frequency of interest, while allowing the input signal to reach the transistor substantially unattenuated; and a bypass resistor coupled between the control terminals of each transistor of the plurality of transistors, the bypass resistor having a resistance such that unbalanced modes are rejected.

* * * * *